United States Patent
Ye

(10) Patent No.: US 10,644,585 B1
(45) Date of Patent: May 5, 2020

(54) POWER FACTOR CORRECTION (PFC) DEVICE WITH SWITCHING ANALYSIS CIRCUIT

(71) Applicant: TEXAS INSTRUMENTS INCORPORATED, Dallas, TX (US)

(72) Inventor: Zhong Ye, Plano, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/189,130

(22) Filed: Nov. 13, 2018

(51) Int. Cl.
*H02M 1/42* (2007.01)
*G05F 1/70* (2006.01)
*G01R 19/165* (2006.01)
*H02M 1/00* (2006.01)

(52) U.S. Cl.
CPC .... *H02M 1/4208* (2013.01); *G01R 19/16547* (2013.01); *G05F 1/70* (2013.01); *H02M 2001/0009* (2013.01); *H02M 2001/0058* (2013.01)

(58) Field of Classification Search
CPC ............ H02M 1/4208; H02M 1/4233; H02M 1/4241; H02M 2001/0009; H02M 2001/0058; G01R 19/16547; G05F 1/70
See application file for complete search history.

(56) References Cited

U.S. PATENT DOCUMENTS

| | | | |
|---|---|---|---|
| 5,677,602 A * | 10/1997 | Paul ................... | H05B 41/2881 315/224 |
| 9,729,066 B1 * | 8/2017 | Lu ......................... | H02M 1/08 |
| 9,893,627 B1 * | 2/2018 | Telefus ................ | H02M 3/158 |
| 2007/0181547 A1 * | 8/2007 | Vogel ................... | B23K 9/1081 219/130.1 |
| 2011/0075462 A1 * | 3/2011 | Wildash .............. | H02M 1/4208 363/127 |
| 2013/0194698 A1 * | 8/2013 | Sase ..................... | H02M 1/4258 360/75 |
| 2015/0022164 A1 * | 1/2015 | Ye ........................ | H02M 1/4225 323/210 |
| 2018/0118040 A1 * | 5/2018 | Kim ....................... | B60L 50/51 |

OTHER PUBLICATIONS

Texas Instrumnets. "TI Designs: TIDA-00961, High-Efficiency, 1.6-kW High-Density GaN-Based 1-MHz CrM Totem-Pole PRC Converter Reference Design." TIDUDT3A—Jan. 2018—Revised Jun. 2018.

* cited by examiner

*Primary Examiner* — Adolf D Berhane
(74) *Attorney, Agent, or Firm* — Mark Allen Valetti; Charles A. Brill; Frank D. Cimino

(57) ABSTRACT

An apparatus includes an alternating current (AC) input node. The apparatus also includes a power factor correction (PFC) circuit with a first inductor coupled between the AC input node and a switch node. The apparatus also includes a switching analysis circuit for the PFC circuit. The switching analysis circuit includes a second inductor inductively coupled to the first inductor. The switching analysis circuit also includes a rectifier coupled to the second inductor. The switching analysis circuit also includes a sensing resistor coupled to the rectifier.

10 Claims, 5 Drawing Sheets

POWER FACTOR CORRECTION (PFC) DEVICE WITH SWITCHING ANALYSIS CIRCUIT

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. In an AC power distribution system, the "power factor" refers to the ratio of real power flowing to a node and apparent power in the circuit (the power factor provides an indication of energy transfer efficiency). As desired, power factor correction (PFC) circuits are used in AC power distribution system to improve energy transfer efficiency. Passive PFC circuits use a filter to pass current at a desired frequency or frequency range to improve the power factor. Meanwhile, active PFC circuits change the waveform of current drawn by a load to improve the power factor.

In active PFC circuits, switches are employed. The operations of such switches consume power and affect the efficiency of the PFC circuit. As switching frequencies increase, the importance of managing hard versus soft switching increases due to hard switching having higher losses compared to soft switching. Unfortunately, analyzing switching conditions is not a trivial task.

SUMMARY

In accordance with at least one example of the disclosure, an apparatus comprises an alternating current (AC) input node. The apparatus also comprises a power factor correction (PFC) circuit with a first inductor coupled between the AC input node and a switch node. The apparatus also comprises a switching analysis circuit for the PFC circuit. The switching analysis circuit comprises a second inductor inductively coupled to the first inductor. The switching analysis circuit also comprises a rectifier coupled to the second inductor. The switching analysis circuit also comprises a sensing resistor coupled to the rectifier.

In accordance with at least one example of the disclosure, a device comprises PFC circuit configured to modify an AC input signal by applying switching operations to a power transistor. The device also comprises a switching analysis circuit inductively coupled to the PFC circuit. The switching analysis circuit is configured to determine a switching analysis signal based on the switching operations, wherein the switching analysis signal is an indirect measure of a turn-on edge during switching operations of the power transistor.

In accordance with at least one example of the disclosure, a system comprises a PFC circuit configured to modify an AC signal by applying a switching control signal to a power transistor. The system also comprises a switching analysis circuit inductively coupled to the PFC circuit, wherein the switching analysis circuit is configured to determine a switching analysis signal indicative of a voltage differential between two current terminals of the power transistor as a function of time. The system also comprises a controller configured to receive the switching analysis signal from the switching analysis circuit and to adjust the switching control signals based on the switching analysis signal.

In accordance with at least one example of the disclosure, a method comprises receiving an alternating current (AC) signal by a power factor correction (PFC) circuit with a switch node. The method also comprises monitoring a voltage across current terminals of a power transistor associated with the switch node using a sensing circuit inductively coupled to the PFC circuit. The method also comprises detecting a switching condition for the power transistor based on said monitoring. The method also comprises adjusting a switching control signal to the power transistor in response to the detected switching condition.

BRIEF DESCRIPTION OF THE DRAWINGS

For a detailed description of various examples, reference will now be made to the accompanying drawings in which.

DETAILED DESCRIPTION

Disclosed herein are power factor correction (PFC) circuits having a switching analysis sub-circuit. Related methods and device options are also disclosed. In some examples, a PFC device includes an alternating current (AC) input node and a PFC circuit with a first inductor coupled between the AC input node and a switch node. In some examples, the PFC circuit is a critical-conduction-mode (CrM) totem-pole PFC circuit. An example PFC circuit includes a switching analysis sub-circuit, where the switching analysis sub-circuit is configured to provide a switching analysis signal available for use by a controller to adjust switching operations of the PFC circuit. In some examples, the switching analysis signal indicates either a hard switching condition or a soft switching condition.

In some examples, the switching analysis sub-circuit comprises a second inductor inductively coupled to the first inductor of the PFC circuit. The switching analysis sub-circuit also includes a rectifier to rectify an AC signal across the second inductor. The switching analysis sub-circuit also includes a sensing resistor having one side coupled to the rectifier, where a voltage drop across the sensing resistor is output from the switching analysis sub-circuit as the switching analysis signal. In one example, a hard switching condition is detected when the voltage across the sensing resistor exceeds a predetermined threshold. In response, a controller adjusts switch drive signals accordingly to generate sufficient negative current for soft switching. If the voltage across the sensing resistor stays below the predetermined threshold over a certain period of time, the switch drive signals will be adjusted to reduce the negative current until the hard switching condition is detected again. To provide a better understanding, various PFC device options, switching analysis sub-circuit options, and related switch control options are described using the figures as follows.

Figure 1:
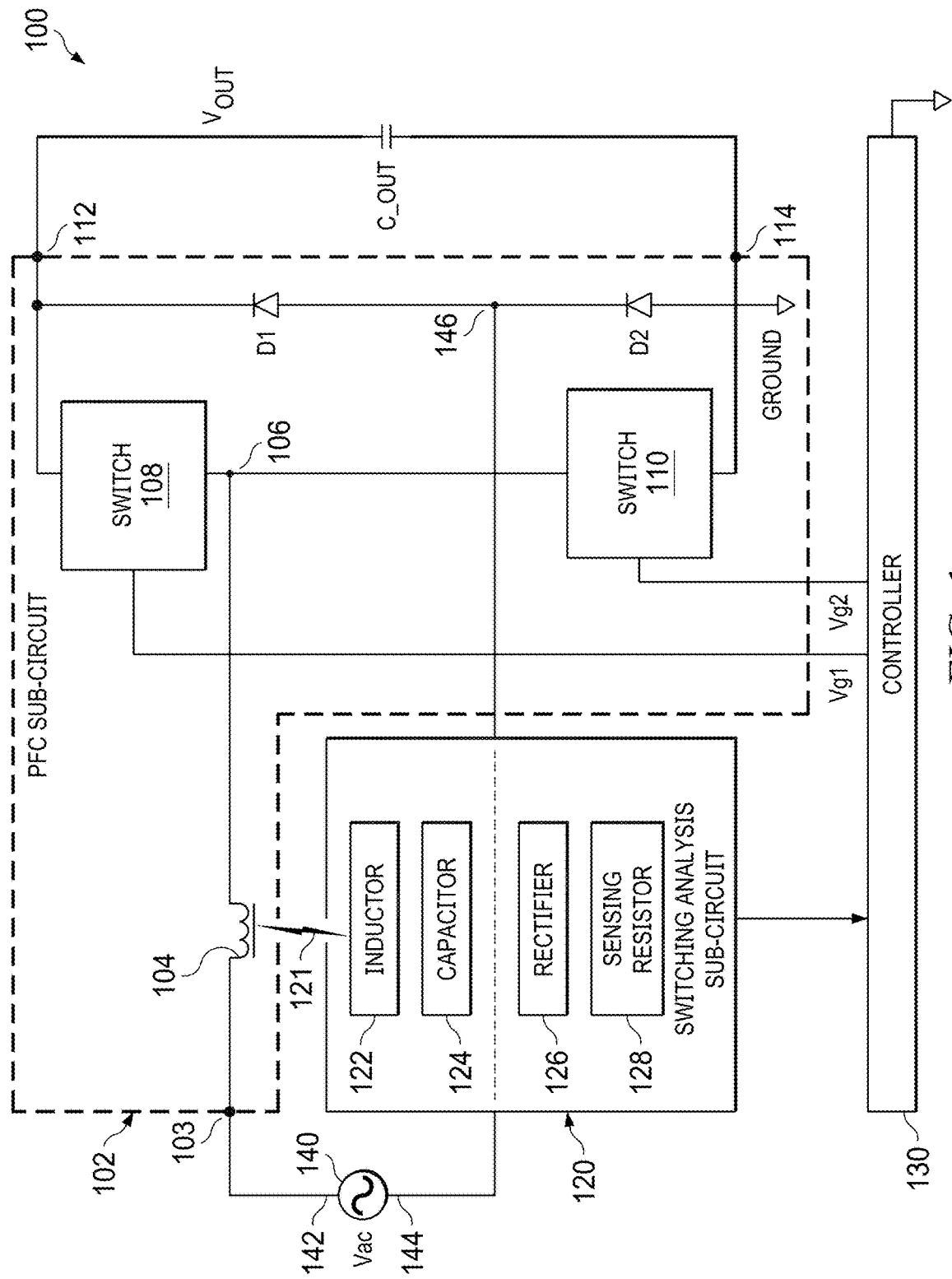
FIG. 1 is a block diagram showing a power factor correction (PFC) circuit in accordance with various examples.

FIG. 1 is a block diagram showing a PFC circuit 100 in accordance with various examples. As shown, the PFC circuit 100 includes a PFC sub-circuit 102 coupled to an AC source 140. More specifically, the PFC sub-circuit 102 includes an inductor 104 between a an AC input node 103 and a switch node 106 between switches 108 and 110. As shown, the AC input node 103 is coupled to a first side 142 of the AC source 140. Meanwhile, a second side 144 of the AC source 140 couples to a node 146 of the PFC sub-circuit 102, where the node 146 is between two diodes (D1 and D2) that control a direction of current flow at the output nodes 112 and 114 of the PFC sub-circuit 102. In the example of FIG. 1, the switches 108 and 110 are operated using control signals (labeled Vg1 and Vg2) provided by a controller 130. In different examples, the controller 130 is an analog controller or digital controller. In some examples, the switches 108 and 110 are power transistors that operate to modify an AC signal (e.g., the AC signal at the switch node 106) based on Vg1 and Vg2, resulting in Vout across the output nodes 112 and 114 of the PFC sub-circuit 102. As shown, an output capacitor (C_OUT) is used to store Vout for use by a load or another power converter stage. An example Vout for the PFC sub-circuit 102 is 400 VDC. In different examples, Vout varies.

Over time, the switch 108 and/or the switch 110 experiences hard switching conditions and soft switching conditions. In an example hard switching, the drain-to-source voltage (Vds) associated with the main switch turn-on edge transitions slowly, resulting in greater switching losses compared to a soft switching condition. In soft switching conditions, the Vds associated with the main switch turn-on edge transitions quickly, resulting in less switching losses compared to a hard switching condition. Instead of monitoring the relevant Vds value directly to determine hard or soft switching conditions, disclosed PFC circuits such as the PFC circuit 100 of FIG. 1 employ a switching analysis sub-circuit 120 that monitors the relevant Vds value indirectly. As used herein, "indirect monitoring" refers to monitoring that involves an inductively coupled sensing circuit (e.g., the switching analysis sub-circuit 120) that provides a scaled value relative to the voltage value (e.g., Vds) being monitored.

In the example of FIG. 1, the switching analysis sub-circuit 120 includes an inductor 122 that is inductively coupled (represented by symbol 121) to the inductor 104 of the PFC sub-circuit 102. The switching analysis sub-circuit 120 also includes a capacitor 124, a rectifier 126, and a sensing resistor 128 (i.e., an RC circuit and a rectifier), where a voltage drop across the sensing resistor 128 is output from the switching analysis sub-circuit 120 as the switching analysis signal. The switching analysis signal is provided to a controller 130. As desired, the controller 130 responds to the switching analysis signal by adjusting Vg1 and/or Vg2 to update switching operations for the switch 108 and/or the switch 110. For example, if the switching analysis signal indicates a hard switching condition (e.g., the voltage level of the switching analysis signal is higher than a threshold), then Vg1 and/or Vg2 are updated to produce a soft switching condition. On the other hand, if the switching analysis signal indicates a soft switching condition (e.g., the voltage level of the switching analysis signal is less than a threshold), Vg1 and Vg2 are not updated.

In some examples, the PFC circuit 100 comprises a combination of discrete components and/or integrated circuit components. In different examples, the PFC sub-circuit 102, the switching analysis sub-circuit 120, and the controller 130 correspond to a single integrated circuit or to multiple integrated circuits. As desired, an output capacitor (e.g., C_OUT) is included with the PFC sub-circuit 102 or is a discrete component coupled to the PFC circuit 100 by a system designer. Also, the AC source 140 is separate from the other components of the PFC circuit 100 and is coupled to the PFC sub-circuit 102 and/or the switching analysis sub-circuit 120 by a system designer.

Figure 2:
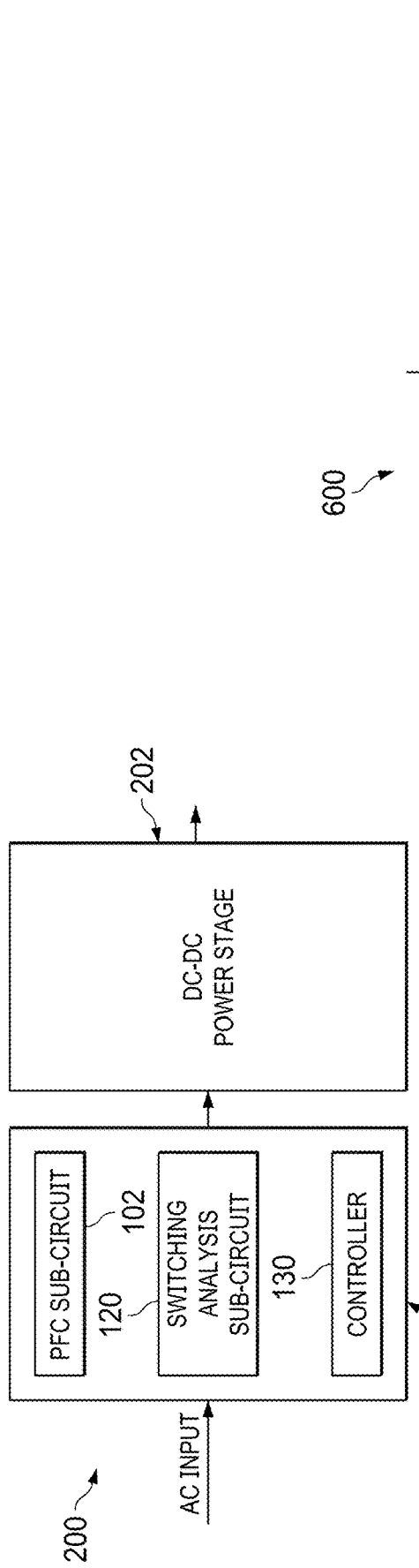
FIG. 2 is a block diagram showing a multi-stage converter in accordance with various examples.

FIG. 2 is a block diagram showing a multi-stage converter 200 in accordance with various examples. In the example of FIG. 2, the multi-stage converter 200 includes the PFC circuit 100 introduced in FIG. 1, where the PFC sub-circuit 102 modifies an AC input signal, and where the switching analysis sub-circuit 120 and the controller 130 update switching operations as needed (e.g., in response to hard switching conditions). One example modification to an AC input signal is rectification. The multi-stage converter 200 also includes DC-DC power stage(s) 202. In some examples, the DC-DC power stage(s) 202 includes switches, switch drivers, output protection circuitry, and/or other components. The output voltage from the DC-DC power stage(s) 202 is provided to a load or another power converter stage.

In some examples, the multi-stage converter 200 comprises a combination of discrete components and/or integrated circuit components. In different examples, the PFC circuit 100 and the DC-DC power stage(s) 202 correspond to a single integrated circuit or to multiple integrated circuits. As desired, an output capacitor (e.g., C_OUT) is included with the PFC sub-circuit 102 or is a discrete component between the PFC circuit 100 and the DC-DC power stage(s) 202. Also, in some examples, an AC source (e.g., the AC source 140) is separate from the other components of the multi-stage converter 200 and is coupled to components of the PFC circuit 100 by a system designer.

Figure 3:
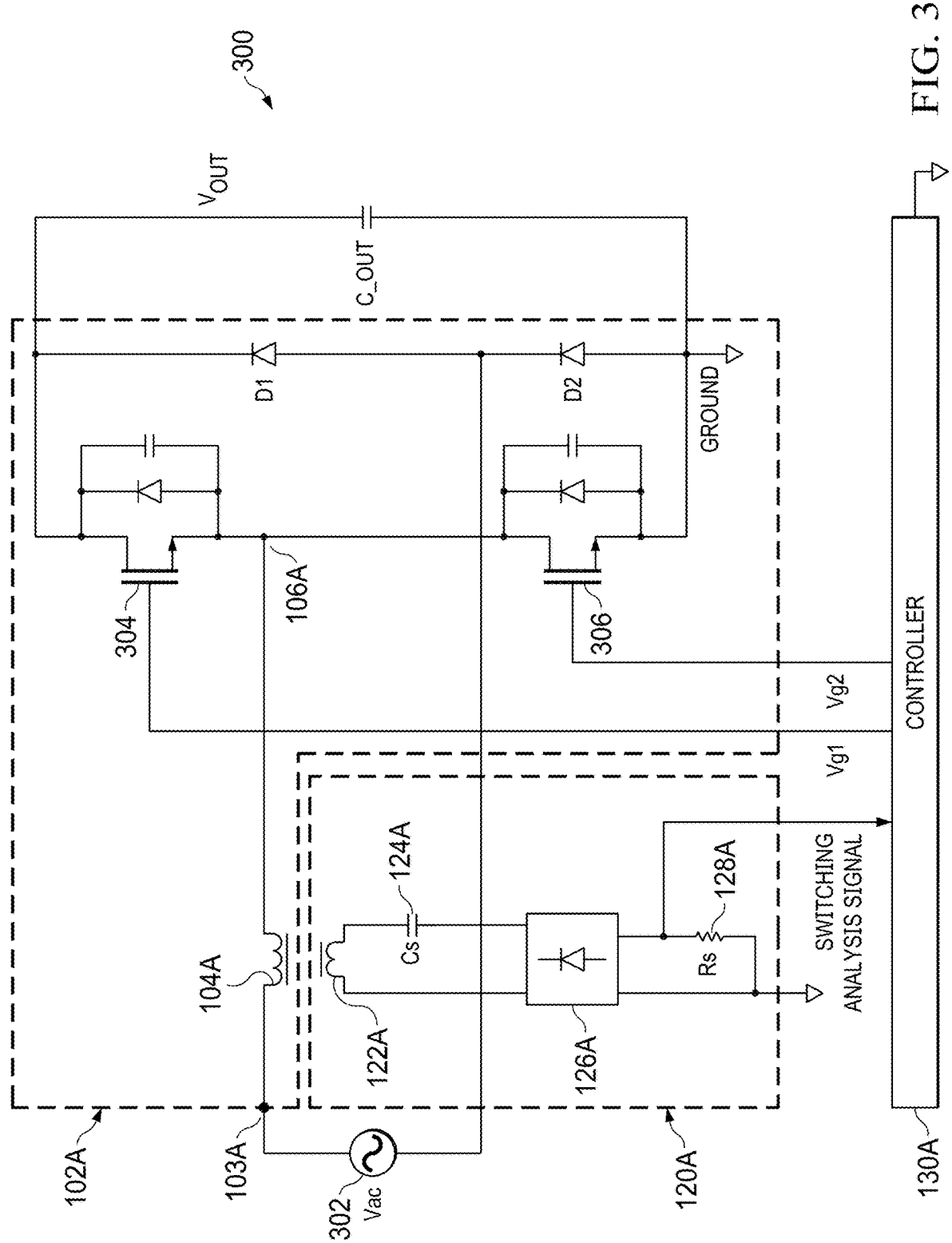
FIG. 3 is a schematic diagram showing a power converter circuit in accordance with various examples.

FIG. 3 is a schematic diagram showing a PFC circuit 300 in accordance with various examples. The PFC circuit 300 is an example of the PFC circuit 100. As shown, the PFC circuit 300 includes a PFC sub-circuit 102A (an example of the PFC sub-circuit 102) with an AC input node 103A, an inductor 104A, a switch node 106A, a power transistor 304 (an example of the switch 108 in FIG. 1), and a power transistor 306 (an example of the switch 110 in FIG. 1). In the example of FIG. 3, each power transistors 304 and 306 includes a transistor having a diode and a capacitor across its current terminals. For the power converter device 300, switching operations of the power transistor 304 are directed by Vg1. Meanwhile, switching operations of the power transistor 306 are directed by Vg2, where Vg1 and Vg2 are provided by the controller 130A to respective control terminals of the power transistors 304 and 306.

In FIG. 3, the PFC sub-circuit 102A includes diodes, D1 and D2, which rectify the AC voltage passed through the switches 108A and 110A such that an output voltage (Vout) is available at the output capacitor, C_OUT. More specifically, D1 has its cathode coupled to a first current terminal of the power transistor 304 and its anode to the cathode of D2 and to one branch of an AC source 302. The anode of D2 couples to a ground node.

As shown, the PFC circuit 300 also includes a switching analysis sub-circuit 120A that includes an inductor 122A inductively coupled to the inductor 104A of the PFC sub-circuit 102A. In some examples, the inductors 104A and 122A are discrete components. In other examples, the inductors 104A and 122A correspond to a discrete or integrated transformer, where the PFC sub-circuit 102A and the switching analysis sub-circuit 120A can be separate or integrated circuits. As shown, one a first side of the inductor 122A couples to a first side of a capacitor 124A (labeled Cs). The second side of the inductor 122A and the second side of the capacitor 124A couple to a rectifier 126A included with the switching analysis sub-circuit 120A. The switching analysis sub-circuit 120A also includes a sensing resistor 128A (labeled Rs) with a first side coupled to the rectifier 126A. The second side of the sensing resistor 128A couples to a ground node, and the voltage across the sensing resistor 128A is the switching analysis signal provided to the controller 130A. In some examples, the switching analysis signal is determined as:

$$\text{switching analysis signal} = Rs*Cs*dv/dt, \quad \text{Equation (1)}$$

where Rs is a resistivity value for the sensing resistor 128A, Cs is a capacitance value for the capacitor 124A, and dv/dt is a change in voltage as a function of time.

The inductor 122A, the capacitor 124A, the rectifier 126A, and the sensing resistor 128A represented in FIG. 3 are examples of the inductor 122, the capacitor 124, the rectifier 126, and the sensing resistor 128 introduced in FIG. 1. In some examples, the rectifier 126 is a full-bridge rectifier. Also, in some examples, the PFC circuit 300 is a CrM totem-pole PFC circuit.

As desired, the controller 130A responds to the switching analysis signal by adjusting Vg1 and/or Vg2 to update switching operations for the power transistor 304 and/or the power transistor 306. For example, if the switching analysis signal indicates a hard switching condition (e.g., the voltage level of the switching analysis signal is higher than a threshold), Vg1 and Vg2 are updated to provide a soft switching condition. On the other hand, if the switching analysis signal indicates a soft switching condition (e.g., the voltage level of the switching analysis signal is less than a threshold), Vg1 and Vg2 are not updated.

In some examples, the PFC sub-circuit 102A of FIG. 3 corresponds to a CrM totem-pole PFC circuit, where the switching analysis sub-circuit 120A monitors switching operations of the CrM totem-pole PFC circuit, and where the controller 130A updates switching control signals for the CrM totem-pole PFC circuit. In different examples, a CrM totem-pole PFC device (e.g., an integrated circuit, multi-die module, or printed circuit board product) includes the PFC sub-circuit 102A, the switching analysis sub-circuit 120A, and the controller 130A, along with one or more components such as an electromagnetic interference (EMI) filters, buffer, operational amplifiers, comparator, power stages (e.g., Gallium nitride (GaN) power stages, half-bridge drivers, power supplies, shunt regulators, DC-DC converters, and/or linear regulators.

Figure 4:
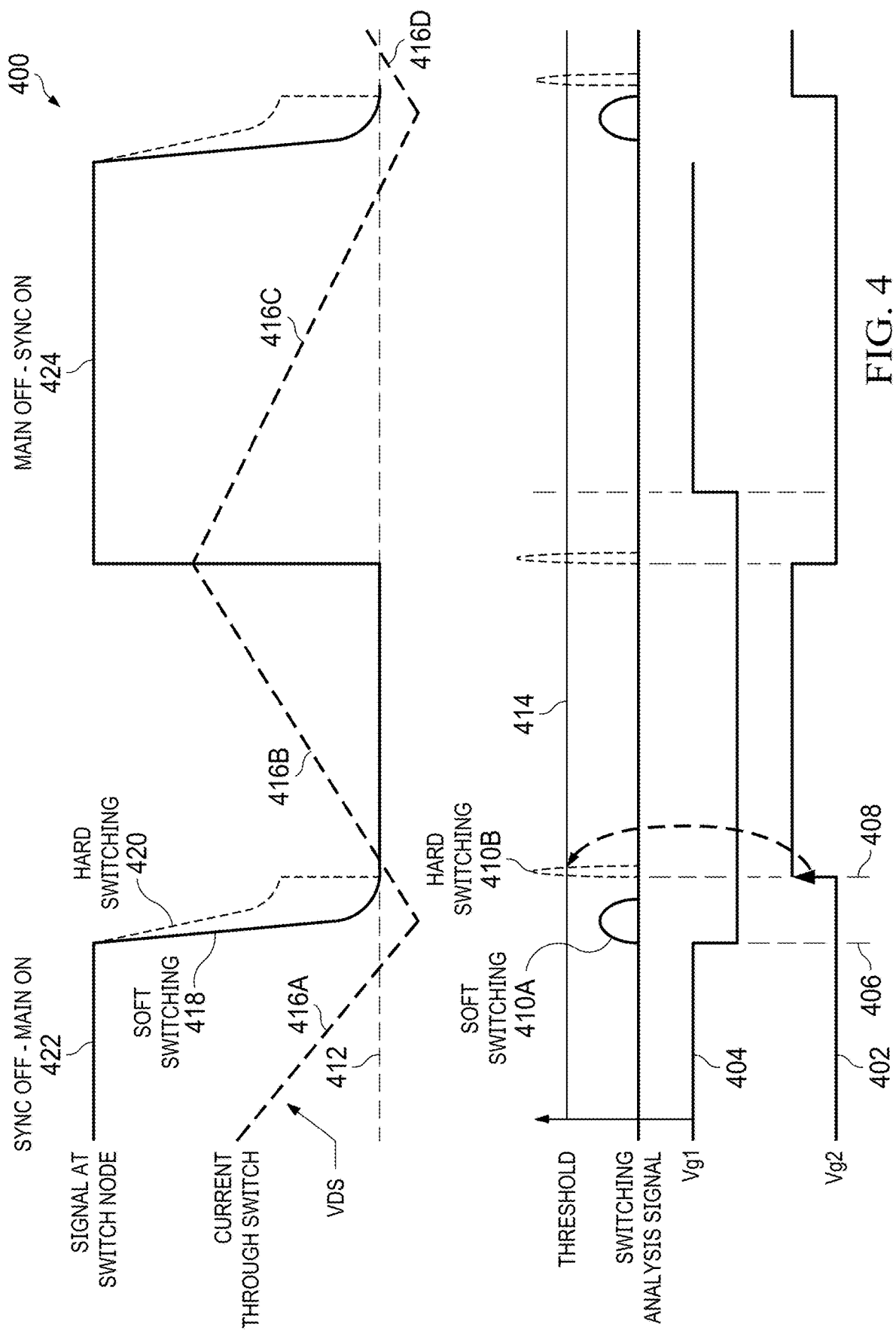
FIG. 4 is a timing diagram showing a switching analysis scenario in accordance with various examples.

FIG. 4 is a timing diagram 400 showing a hard and soft switching analysis scenario in accordance with various examples. In the timing diagram 400, a main switch signal 402 and a sync switch signal 404 are represented, where the main switch signal 402 sometimes corresponds to Vg1 and the sync switch signal 404 sometimes corresponds to Vg2. At other times, the main switch signal 402 sometimes corresponds to Vg2 and the sync switch signal 404 sometimes corresponds to Vg1. This is because each of the PFC switches (e.g., switch 108 and 110 in FIG. 1, or power transistors 304 and 306 in FIG. 3) operate as a main switch and a sync switch over time. As shown, the main switch signal 402 is high when the sync switch signal 404 is low with some offset between edges of the main switch signal 402 and edges of the sync switch signal 404. In FIG. 4, the lines 416A-416D represent current levels for the main switch, where threshold 412 is where the current has a negative value, which causes Vds to drop.

In the timing diagram 400, a main switch turn-on edge occurs when the sync switch signal 404 is low while the main switch signal 402 is low. When this occurs the main switch turn-on edge corresponds to Vds dropping from a default value corresponding to line 422 (e.g., 400 V) down to a lower value such near or at zero (e.g. 10 V). In FIG. 4, curve 418 represents a main switch turn-on edge in a soft switching condition. Meanwhile, curve 420 represents a main switch turn-on edge in a hard switching condition. During a soft switching condition, the switching analysis signal 410A (provided by a switching analysis sub-circuit such as the switching analysis sub-circuit 120 of FIGS. 1 and 2, or the switching analysis sub-circuit 120A of FIG. 3) has a voltage level that is less than a threshold 414. In contrast, during a hard switching condition, the switching analysis signal 410B has a voltage level that is greater than the threshold 414. In response to a hard switching condition, the sync signal 404 is adjusted by increasing the "on" time, which results in the negative slope 416A having a longer interval, which forces Vds to drop towards zero.

Figure 5:
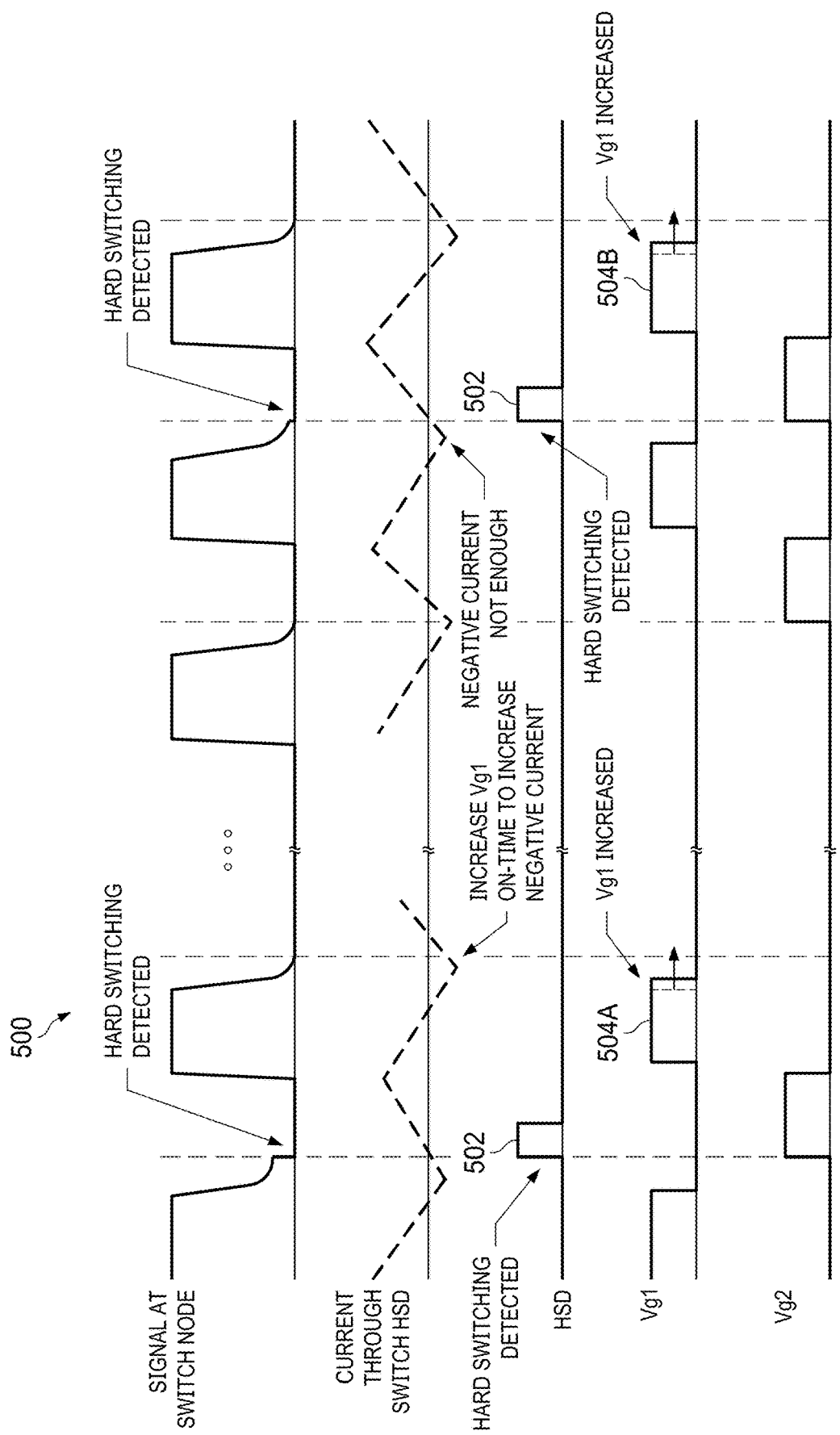
FIG. 5 is another timing diagram showing a switching analysis scenario in accordance with various examples.

FIG. 5 is another timing diagram 500 showing a switching analysis scenario in accordance with various examples. Relative to timing diagram 400 of FIG. 4, the timing diagram 500 of FIG. 5 shows an example response to hard switching conditions (not just hard switching detection as in FIG. 4). In the timing diagram 500, hard switching is detected as described for the timing diagram 400 of FIG. 4 (a switching analysis signal level exceeds a threshold such as the threshold 414). In response, a hard switching detected (HSD) signal 502 is asserted to a controller or within a controller such as the controller 130 of FIGS. 1 and 2, or the controller 130A of FIG. 3. A controller responds to each HSD signal by increasing the syncFET turn-on time, Vg1, (in the positive AC cycle in this example), to increase the negative current until a related circuit (e.g., the PFC sub-circuit 102 of FIGS. 1 and 2, or the PFC sub-circuit 102A of FIG. 3) enters a soft switching condition. If no hard switching signal is detected for a threshold number of switching cycles, a controller can reduce the syncFET turn-on time until a hard switching condition occurs as indicated by the switching analysis signal 410 of FIG. 4 and/or the HSD signals 502 of FIG. 5. In some examples, a controller is configured regulate the negative current to ensure a PFC circuit (e.g., the PFC circuit 100 or the PFC circuit 300) does not stay in a hard switching condition for too long and does not have excessive negative current.

Figure 6:
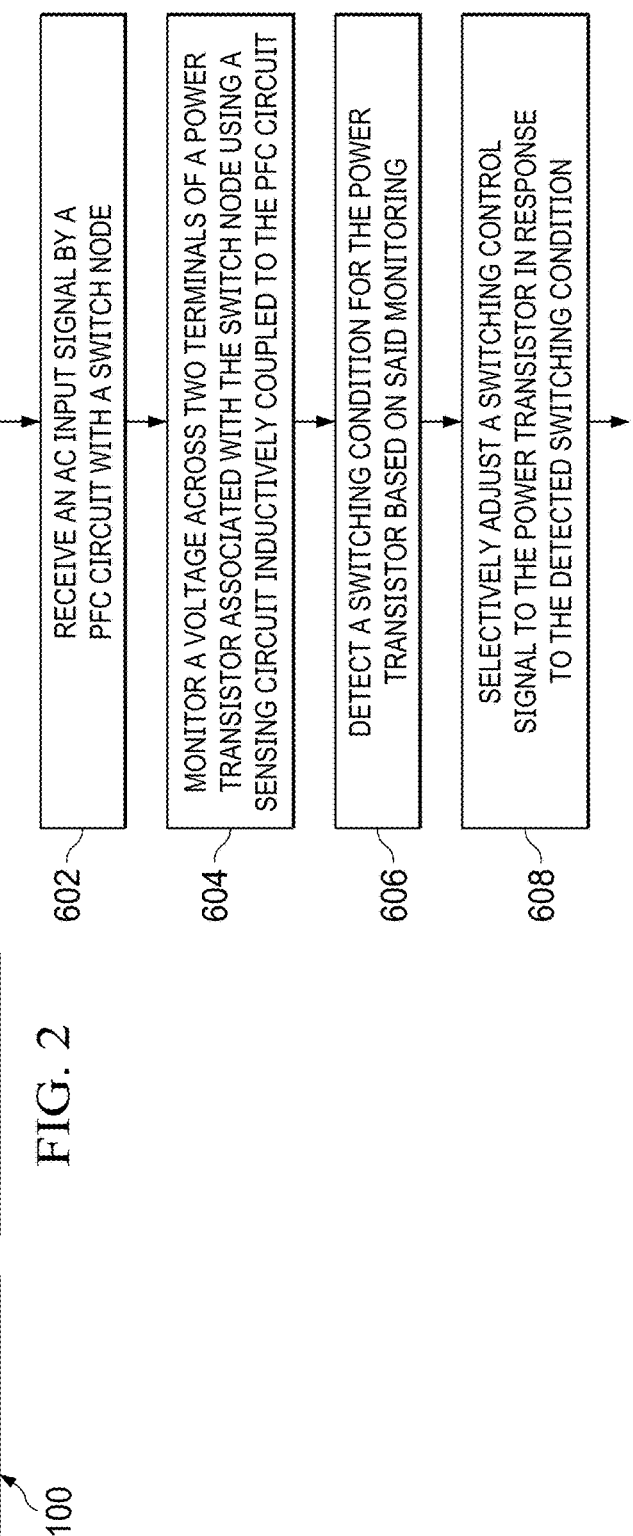
FIG. 6 is a flow chart showing a switching control method for a PFC circuit in accordance with various examples.

FIG. 6 is a flow chart showing a switching control method 600 for a PFC circuit (e.g., the PFC circuit 100 in FIG. 1, or the PFC circuit 300 in FIG. 3) in accordance with various examples. As shown, the method 600 comprises receiving an AC input signal by a PFC circuit (or PFC sub-circuit) with a switch node at block 602. At block 604, a voltage across a terminal of a power transistor associated with the switch node a sensing circuit (e.g., the switching analysis sub-circuit 120 in FIGS. 1 and 2, or the switching analysis sub-circuit 120A in FIG. 3) is monitored using a sensing circuit inductively coupled to the PFC circuit. At block 606, a switching condition for the power transistor is detected based on the monitoring operations of block 604. At block 608, a switching control signal to the power transistor is selectively adjusted in response to the detected switching condition. In some examples, selectively adjusting the switching control signal at block 608 comprises adjusting the switching control signal to increase a negative current interval associated with the power transistor in response to determining that a voltage level of the output of the sensing circuit is greater than a threshold level (indicative of a hard switching condition). In some examples, the method 600 is used with a CrM totem-pole PFC circuit. As desired, the threshold level used to define a hard switching condition is adjusted.

With the disclosed PFC circuit and switch analysis circuit isolated switching node information is obtained (without directly measuring the drain-to-source voltage (Vds) associated with the main switch turn-on edge). In some examples, a simple series connected RC circuit is used to detect switching node dv/dt. Advantageously, no high voltage detection circuit is needed for the switching analysis operations described herein.

Certain terms have been used throughout this description and claims to refer to particular system components. As one skilled in the art will appreciate, different parties may refer to a component by different names. This document does not intend to distinguish between components that differ only in name but not in their respective functions or structures. In this disclosure and claims, the terms "including" and "comprising" are used in an open-ended fashion, and thus should be interpreted to mean "including, but not limited to . . . ." The recitation "based on" is intended to mean "based at least in part on." Therefore, if X is based on Y, X may be a function of Y and any number of other factors.

The above discussion is meant to be illustrative of the principles and various embodiments of the present invention. Numerous variations and modifications will become apparent to those skilled in the art once the above disclosure is fully appreciated. While the disclosed examples refer to circuits and sub-circuits for clarity, it should be appreciated that term "sub-circuit" herein refers to a circuit. It is intended that the following claims be interpreted to embrace all such variations and modifications.

What is claimed is:

1. A system comprising:
    a power factor correction (PFC) circuit configured to modify an alternating current (AC) signal by applying a switching control signal to a power transistor;
    a switching analysis circuit configured to determine a switching analysis signal indicative of a voltage differential between two current terminals of the power transistor as a function of time; and
    a controller configured to receive the switching analysis signal from the switching analysis circuit and to adjust the switching control signals based on the switching analysis signal, wherein the controller is an analog controller configured to adjust the switching control signal to increase a negative current interval in response to the switching analysis signal being greater than a threshold.

2. The system of claim 1, wherein the switching analysis circuit comprises a capacitor, a rectifier, and a sensing resistor, wherein the switching analysis circuit is configured to output a voltage drop across the sensing resistor as the switching analysis signal.

3. The system of claim 2, wherein the switching analysis signal is generated as function of a resistivity value for the sensing resistor, a capacitance value for the capacitor, and a change in voltage as a function of time.

4. The system of claim 2, wherein the rectifier is a full-bridge rectifier, and wherein the PFC circuit comprises a critical-conduction-mode (CrM) totem-pole PFC circuit.

5. A method comprising:
    receiving an alternating current (AC) signal by a power factor correction (PFC) circuit with a switch node;
    monitoring a voltage across current terminals of a power transistor associated with the switch node using a sensing circuit inductively coupled to the PFC circuit;
    detecting a switching condition for the power transistor based on said monitoring; and
    adjusting a switching control signal to the power transistor in response to the detected switching condition, wherein adjusting the switching control signal comprises adjusting the switching control signal to increase a negative current interval associated with the power transistor in response determining that a voltage level of the output of the sensing circuit is greater than a threshold level.

6. The method of claim 5, wherein the PFC circuit comprises a critical-conduction-mode (CrM) totem-pole PFC circuit, and wherein the method further comprising selecting the threshold level.

7. A system comprising:
    a power factor correction (PFC) circuit configured to modify an alternating current (AC) signal by applying a switching control signal to a power transistor;
    a switching analysis circuit configured to determine a switching analysis signal indicative of a voltage differential between two current terminals of the power transistor as a function of time; and
    a controller configured to receive the switching analysis signal from the switching analysis circuit and to adjust the switching control signals based on the switching analysis signal, wherein the controller is a digital controller configured to adjust the switching control signal to increase a negative current interval in response to the switching analysis signal being greater than a threshold.

8. The system of claim 7, wherein the switching analysis circuit comprises a capacitor, a rectifier, and a sensing resistor, wherein the switching analysis circuit is configured to output a voltage drop across the sensing resistor as the switching analysis signal.

9. The system of claim 8, wherein the switching analysis signal is generated as function of a resistivity value for the sensing resistor, a capacitance value for the capacitor, and a change in voltage as a function of time.

10. The system of claim 7, wherein the rectifier is a full-bridge rectifier, and wherein the PFC circuit comprises a critical-conduction-mode (CrM) totem-pole PFC circuit.

* * * * *